United States Patent
Wuidart et al.

(10) Patent No.: US 7,427,802 B2
(45) Date of Patent: Sep. 23, 2008

(54) IRREVERSIBLE REDUCTION OF THE VALUE OF A POLYCRYSTALLINE SILICON RESISTOR

(75) Inventors: Luc Wuidart, Pourrieres (FR); Alexandre Malherbe, Trets (FR); Michel Bardouillet, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 711 days.

(21) Appl. No.: 10/504,274

(22) PCT Filed: Feb. 11, 2003

(86) PCT No.: PCT/FR03/00445

§ 371 (c)(1),
(2), (4) Date: Sep. 20, 2004

(87) PCT Pub. No.: WO03/069656

PCT Pub. Date: Aug. 21, 2003

(65) Prior Publication Data

US 2005/0173779 A1    Aug. 11, 2005

(30) Foreign Application Priority Data

Feb. 11, 2002    (FR) .................. 02 01635

(51) Int. Cl.
*H01L 23/00* (2006.01)
*H01L 21/326* (2006.01)
*H01C 7/13* (2006.01)

(52) U.S. Cl. .................. 257/538; 438/466; 438/467; 338/20

(58) Field of Classification Search ............. 438/466, 438/467; 257/538; 338/20
See application file for complete search history.

(56) References Cited

U.S. PATENT DOCUMENTS

| 4,146,902 A | * | 3/1979 | Tanimoto et al. ............. 257/381 |
| 4,210,996 A | * | 7/1980 | Amemiya et al. .......... 29/610.1 |
| 5,029,284 A | * | 7/1991 | Feldbaumer et al. .......... 326/30 |
| 5,187,559 A | | 2/1993 | Isobe et al. |
| 5,418,738 A | * | 5/1995 | Abadeer et al. ............. 365/100 |
| 5,757,264 A | | 5/1998 | Petit |
| 6,291,306 B1 | * | 9/2001 | Hsu et al. .................. 438/385 |

(Continued)

FOREIGN PATENT DOCUMENTS

DE            19839141 A1 *  3/2000

(Continued)

OTHER PUBLICATIONS

Feldbaumer et al., "Pulse Current Trimming of Polysilicon Resistors", Apr. 1995, IEEE Transactions on Electron Devices, vol. 42, No. 4, pp. 689-696.*

(Continued)

*Primary Examiner*—Evan Pert
(74) *Attorney, Agent, or Firm*—Lisa K. Jorgenson; James H. Morris; Wolf, Greenfield & Sacks, P.C.

(57) ABSTRACT

The invention relates to a method and device for the irreversible reduction of the value of an integrated polycrystalline silicon resistor. The inventive method consists in temporarily subjecting the resistor to a stress current which is greater than a current (Im) for which the value of the resistor is maximum.

13 Claims, 3 Drawing Sheets

U.S. PATENT DOCUMENTS

| | | | | |
|---|---|---|---|---|
| 6,532,568 | B1 * | 3/2003 | Kotowski | 716/1 |
| 7,119,656 | B2 * | 10/2006 | Landsberger et al. | 338/195 |
| 7,249,409 | B2 * | 7/2007 | Landsberger et al. | 29/610.1 |
| 2002/0008302 | A1 * | 1/2002 | Singh et al. | 257/538 |

FOREIGN PATENT DOCUMENTS

| | | | |
|---|---|---|---|
| JP | 54-132797 | * | 10/1979 |
| JP | 63-16652 | * | 1/1988 |
| JP | 1-300552 | * | 12/1989 |
| JP | 2000-223664 | * | 8/2000 |

OTHER PUBLICATIONS

Feldbaumer et al., "Theory and Application of Polysilicon Resistor Trimming", 1995, Solid-State Electronics, vol. 38, No. 11, pp. 1861-1869.*

Das et al., "Electrical Trimming of Ion-Beam-Sputtered Polysilicon Resistors by High Current Pulses", Aug. 1994, IEEE Transactions on Electron Devices, vol. 41, No. 8, pp. 1429-1434.*

Babcock et al., "Polysilicon Resistor Trimming for Packaged Integrated Circuits", 1993, IEDM, pp. 247-250.*

Kato et al., "A Monolithic 14 Bit D/A Converter Fabricated with a New trimming Technique (DOT)", Oct. 1984, IEEE Journal of Solid-State Circuits, vol. sc-19, No. 5, pp. 802-807.*

Amemiya et al., "Electrical Trimming of Heavily Doped Polycrystalline Silicon Resistors", Nov. 1979, IEEE Transactions on Electron Devices, vol. ED-26, No. 11, pp. 1738-1742.*

Kato et al., "Electrical Trimming of Polycrystalline Silicon Resistors and its Application to Analog IC's", Nov. 1980, IEEE Transactions on Electron Devices, vol. ED-27, No. 11, p. 2194.*

International Search Report from corresponding International Application No. PCT/FR03/00445, filed Feb. 11, 2003.

Kato, et al. *A Physical Mechanism of Current-Induced Resistance Decrease in Heavily Doped Polysilicon Resistors*, IEEE Transactions on Electron Devices, IEEE Inc. New York, vol. 29, No. 8, Aug. 1982, pp. 1156-1161 XP000835577.

Babcock, J.A., et al. *Precision Electrical Trimming of Very Low TCR Poly-Siege Resistors*, IEEE Electron Device Letters, IEEE Inc. New York, vol. 21, No. 6, Jun. 2000, pp. 283-285, XP000951962.

* cited by examiner

IRREVERSIBLE REDUCTION OF THE VALUE OF A POLYCRYSTALLINE SILICON RESISTOR

BACKGROUND OF THE INVENTION

1. Field of the Invention

The present invention relates to integrated resistors. It more specifically relates to resistors made of polysilicon in an integrated circuit.

FIG. 1 shows in a very simplified partial perspective view, an example of a polysilicon resistor to which the present invention applies.

2. Discussion of the Related Art

Such a resistor 1 is formed of a polysilicon track (also called a bar) obtained by etching a layer deposited on an insulating substrate 2. Substrate 2 is directly formed of the integrated circuit substrate or is an insulating layer forming integrated circuit substrate or the like for resistor 1. Resistor 1 is connected, by its two ends, to conductive tracks (for example, metal tracks) 3 and 4 intended to connect the resistive bar to the other integrated circuit elements according to the application. The simplified representation of FIG. 1 makes no reference to the different insulating and conductive layers generally forming the integrated circuit. To simplify, only resistive bar 1 laid on insulating substrate 2 and in contact, by the ends of its upper surface, with the two metal tracks 3 and 4, has been shown. In practice, the connections of resistive element 1 to the other integrated circuit components are obtained by wider polysilicon tracks starting from the ends of bar 1, in the alignment thereof. In other words, resistive element 1 is generally formed by making a section of a polysilicon track narrower than the rest of the track.

Resistance R of element 1 is given by the following formula:

$$R = \rho(L/s),$$

where $\rho$ designates the resistivity of the material (polysilicon, possibly doped) forming the track in which element 1 is etched, where L designates the length of element 1, and where s designates its section, that is, its width l multiplied by its thickness e. Resistivity $\rho$ of element 1 depends, among others, on the possible doping of the polysilicon forming it. In certain cases, the polysilicon element is covered with a metal layer, the resistive element then combining the polysilicon and the overlying metal.

Most often, upon forming of an integrated circuit, the resistors are provided by referring to resistance per square $R_\square$. This square resistance is defined as being the resistivity of the material divided by the thickness with which it is deposited. Taking the above relation giving the resistance of an element 1, the resistance is thus given by the following relation:

$$R = R_\square * L/l.$$

Quotient L/l corresponds to what is called the number of squares forming resistive element 1. This represents, as seen from above, the number of squares of given dimension depending on the technology, put side by side to form element 1.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

In recent technologies, the use of polysilicon resistors is limited to resistors that carry, in operation, currents smaller than 100 µA. For greater currents, a diffusion resistor is generally used. Polysilicon is however preferred to a dopant diffusion, since the occurrence of stray capacitances with the substrate is avoided.

It would be desirable to be able to modify the value of the resistance of a polysilicon element (1, FIG. 1) after manufacturing. Up to now, the only envisaged modification is a physical deterioration (melting), a strongly conductive polysilicon element being used as a fuse. For this purpose, a very high current is imposed (on the order of one tenth of an ampere) in the polysilicon element to cause a physical deterioration thereof and obtain an open circuit (fuse).

SUMMARY OF THE INVENTION

The present invention aims at obtaining a decrease in the value of an integrated polysilicon resistor after manufacturing. The present invention more specifically aims at obtaining a decrease in the resistance value, with respect to its original (nominal) value after manufacturing.

The present invention also aims at providing a solution which does not require applying destructive currents in the circuit and which is, accordingly, compatible with a decrease in the value of the resistance once the circuit is in place in its application.

To achieve these and other objects, the present invention provides a method for irreversibly decreasing the value of an integrated polysilicon resistor, comprising temporarily submitting the resistor to a constraint current greater than a current for which the value of the resistance exhibits a maximum.

According to an embodiment of the present invention, the constraint current to which the resistor is submitted is beyond an operating current range of an integrated circuit comprising this resistor.

According to an embodiment of the present invention, the following steps are carried out:

increasing step by step the current in the resistor; and measuring, after each application of a greater current, the value of the resistance in its normal functional environment.

According to an embodiment of the present invention, a predetermined table of correspondence between the constraint current and the desired final resistance is used to apply the adapted constraint current to the resistor.

According to an embodiment of the present invention, the constraint current is comprised between 1 and 10 mA.

According to an embodiment of the present invention, the dopant concentration of the polycrystalline silicon is comprised between $1 \times 10^{13}$ and $1 \times 10^{16}$ atoms/cm$^3$.

The present invention also provides a device for irreversibly decreasing the value of an integrated polysilicon resistor, comprising a circuit for temporarily imposing on the resistor a constraint current greater than a current value for which the value of the resistance exhibits a maximum.

According to an embodiment of the present invention, the polysilicon resistor is connected to at least one switch of selection between an application circuit and a circuit controlling the decrease in its value.

According to an embodiment of the present invention, the decrease control circuit comprises a voltage source capable of being connected across the resistor, said voltage source being controllable by a circuit synchronizing the switching of said switch.

According to an embodiment of the present invention, the control circuit comprises a current source capable of being connected in series with the resistor across two supply terminals, the current source being controllable by a circuit for synchronizing said switch.

The present invention also provides a resistive element controllable to irreversibly decrease its value comprising:

a polysilicon resistor; and a control circuit capable of imposing the flowing of a constraint current greater than a value for which the value of the resistance is maximum.

According to an embodiment of the present invention, the connection of the resistor to the control circuit is performed via at least one switch of selection between a connection to an application circuit and a connection to said control circuit.

The foregoing objects, features and advantages of the present invention, will be discussed in detail in the following non-limiting description of specific embodiments in connection with the accompanying drawings, in which:

DETAILED DESCRIPTION

Figure 1:
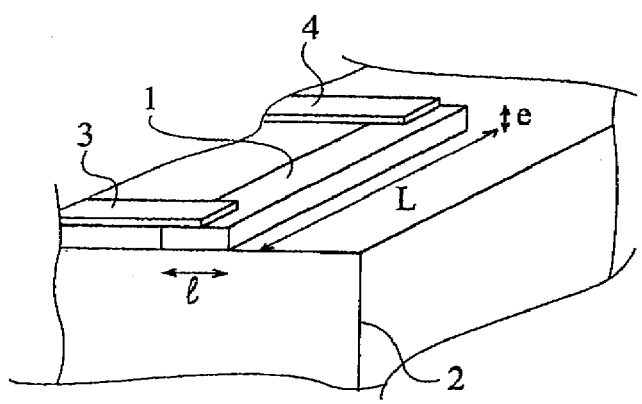
FIG. 1, previously described, partially and schematically shows an example of a polysilicon resistive element of the type to which the present invention applies.

The same elements have been designated with the same references in the different drawings. For clarity, only those method steps and those elements of the device that are necessary to the understanding of the present invention have been shown in the drawings and will be described hereafter. In particular, the practical forming of a polysilicon resistor by deposition and etching has not been detailed, since the present invention is implementable on a conventionally-formed resistor.

A feature of the present invention is to temporarily impose, in a polysilicon resistor, the value of which is desired to be irreversibly decreased, a so-called constraint current for which the resistance reaches a maximum value, this current being beyond the normal operating current range of this resistance. In other words, the polysilicon resistivity is decreased in the operating current range, in a stable and irreversible manner, by imposing in the corresponding resistive element the flowing of a current beyond the operating current range.

Another feature of the present invention is that the current used to decrease the resistance value is, conversely to a fusible element, non-destructive for the polysilicon element.

Figure 2:
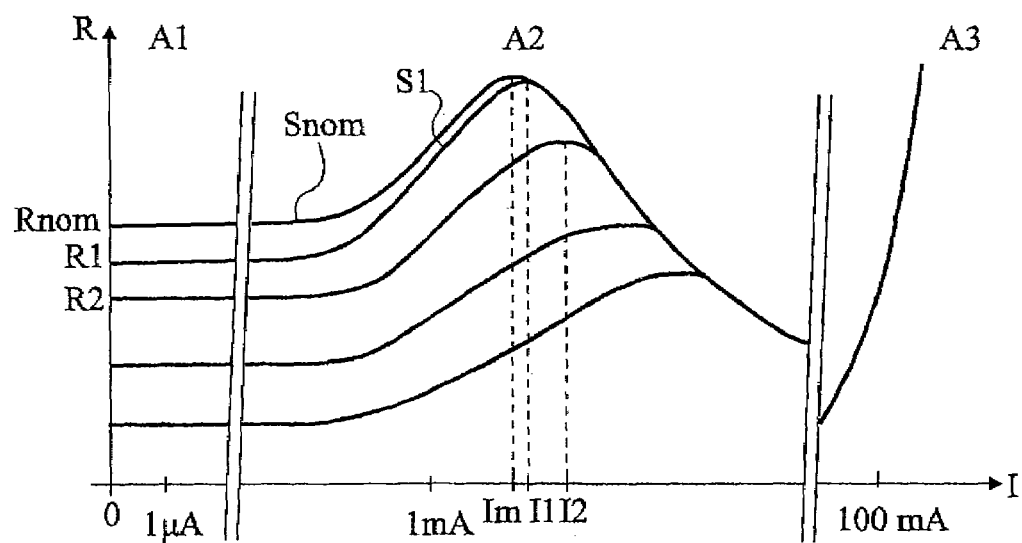
FIG. 2 illustrates, in a curve network representing the value of the resistance versus the current in a polysilicon element, the implementation of the method of irreversible decrease of the value of a resistor according to the present invention.

FIG. 2 illustrates, with a curve network giving the resistance of a polysilicon element of the type shown in FIG. 1 according to the current flowing therethrough, an embodiment of the present invention.

It is assumed that the polysilicon having been used to manufacture resistive element 1 exhibits a nominal resistivity giving element 1, for the given dimensions l, L, and e, a resistance value $R_{nom}$. This nominal (original) value of the resistance corresponds to the value taken in a stable manner by resistive element 1 in the operating current range of the system, that is, generally, for currents smaller than 100 µA.

According to the present invention, to decrease the value of the resistance and to switch in an irreversible and stable manner, for example, to a value R1 smaller than $R_{nom}$, a so-called constraint current (for example, I1), greater than a current Im for which the value of resistance R of element 1 is maximum without for all this being infinite, is imposed across resistive element 1. As illustrated in FIG. 2, once current I1 has been applied to resistive element 1, a stable resistance of value R1 is obtained in range A1 of operating currents of the integrated circuit. In fact, curve $S_{nom}$ of the resistance according to the current is stable for relatively small currents (smaller than 100 µA). This curve starts increasing for substantially higher currents on the order of a few milliamperes, or even more (range A2). In this current range, curve $S_{nom}$ crosses a maximum for value Im. The resistance then progressively decreases. In FIG. 2, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the value of the resistance or more specifically of the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal integrated circuit operation (range A1), that is, outside of the normal resistor operation.

Theoretically, once the value of the polysilicon resistance has been lowered to a lower value (for example, R1 in FIG. 2), an irreversible decrease in this value can further be implemented. It is enough, to achieve this, to exceed maximum current I1 of the new curve S1 of the resistance according to the current. For example, the value of the current may be increased to reach a value I2. When the current is decreased again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance ($R_{nom}$, R1, R2) from which the decrease is caused.

What has been expressed hereabove as the resistance value in fact corresponds to a decrease in the resistivity of the polysilicon forming the resistive element. The present inventors consider that the polysilicon crystalline structure is modified in a stable manner and that, in a way, the material is reflowed, the obtained final crystalline structure depending on the maximum current reached.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been manufactured.

The practical forming of a polysilicon resistor according to the present invention does not differ from the forming of a conventional resistor. Starting from an insulating substrate, a polysilicon layer is deposited and etched according to the dimensions desired for the resistance. Since the deposited polysilicon thickness is generally determined by the technology, the two dimensions which can be adjusted are the width and the length. Generally, an insulator is redeposited on the polysilicon bar thus obtained. In the case of an on-line interconnection, width l will have been modified with respect to the wider access tracks to be more strongly conductive. In the case of an access to the ends of the bar from the top as shown in FIG. 1, vias will be made in the overlying insulator (not shown) of the polysilicon bar to connect contact metal tracks 3 and 4.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, or to switch from a given value (smaller than the nominal value) to a still lower value, several methods may be used according to the present invention.

According to a first embodiment, the current is progressively (step by step) increased in the resistor. After each application of a higher current, it is returned to the operating current range and the resistance value is measured. As long as current point Im has not been reached, this resistance value will remain at value $R_{nom}$. As soon as current point Im is exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it conditions the number of possible decreases. The higher the pitch, the more the jumps between values will be high.

According to a second embodiment, the different currents to be applied to pass from the different resistance values to smaller values are predetermined, for example, by measurements. This predetermination of course takes into account the nature of the polysilicon used as well as, preferentially, the square resistance, that is, the resistivity of the material and the thickness with which it is deposited. Indeed, since the curves illustrated by FIG. 2 may also be read as the curves of the square resistance, the calculated values can be transposed to the different resistors of an integrated circuit defined by the widths and the lengths of the resistive sections. According to this second embodiment, the value of the constraint current to be applied to the resistive element to decrease its value in an irreversible and stable manner can then be predetermined.

The two above embodiments can of course be combined. For example, the constraint current from a table is applied prior to adjusting step by step the irreversible decrease.

According to the present invention, the irreversible decrease in the resistance or resistivity can be performed after manufacturing when the circuit is in its functional environment. In other words, the integrated resistor may be associated with a device controlling the decrease in its value, which will be described hereafter in relation with FIGS. 3 and 4.

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, any additional duration of application of the constraint current does not modify, at least at the first order, the obtained resistance. Moreover, even if in a specific application, it is considered that the influence of the duration of application of the constraint cannot be neglected, the two preferred embodiments (predetermining constraint values in duration and intensity, or step-by-step progression to the desired value) are perfectly compatible with the taking into account of the duration of application of the constraint.

As a specific example of embodiment, an $N^+$ doped polysilicon resistor having a cross-section of 0.225 square micrometer (l=0.9 μm, e=0.25 μm) and a length L of 45 micrometers has been formed. With the polysilicon used and the corresponding doping, the nominal resistance is approximately 6300 ohms. This corresponds to a resistance per square of approximately 126 ohms (50 squares). By applying to this resistor a current greater than three milliamperes, a decrease in its value, stable for an operation under currents reaching 500 microamperes has been caused. With a current of 3.1 milliamperes, the value of the resistance has been lowered to approximately 4500 ohms. By applying to the resistor a current of 4 milliamperes, the value of the resistance has been decreased down to approximately 3000 ohms. The obtained resistance values are the same for constraint durations ranging from 100 microseconds to more than 100 seconds.

Of course, the above examples as well as the given orders of magnitude of currents and resistances for the different ranges concern present technologies. The currents of ranges A1, A2, and A3 may be different (smaller) for more advanced technologies and may be transposed to current densities. The principle of the present invention is not modified by this. There are still three ranges and the intermediary range is used to force the resistivity decrease.

Figure 3:
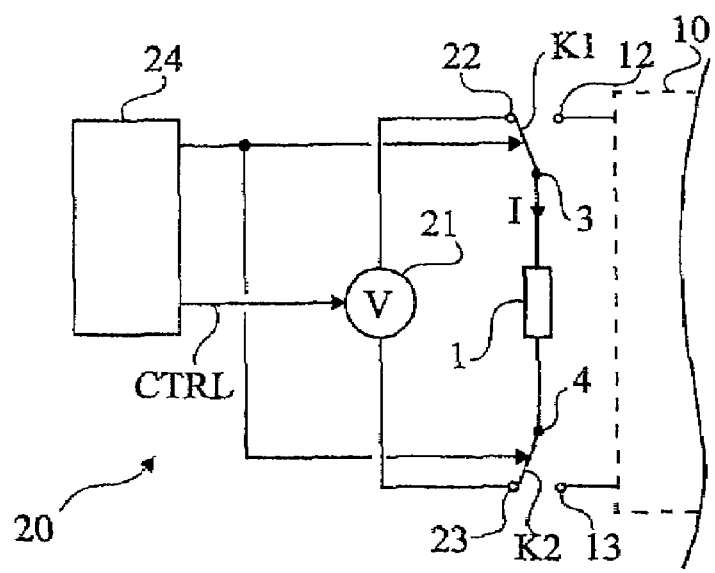
FIG. 3 very schematically shows a first embodiment of a device for controlling an irreversible decrease in the value of a polysilicon resistor according to the present invention.

FIG. 3 shows a first embodiment of a device for irreversibly decreasing the value of a polysilicon resistor 1 according to the present invention. Resistor 1 is used by a circuit 10, partially illustrated, in dotted lines, in FIG. 3. Circuit 10 may have any content, provided to require a resistor, the value of which is desired to be decreased.

Control device 20 according to the present invention here comprises a controllable voltage source 21 (V) for imposing a current in resistor 1. To select a connection mode of resistor 1 between the normal operation connection to circuit 10 and a temporary connection to circuit 20, terminals 3 and 4 of resistor 1 are each connected to a switch K1, K2 (for example, a MOS transistor) of connection either to terminals 22, 23 of voltage source 21, or to terminals 12, 13 of access to circuit 10. Switches K1 and K2 are simultaneously controlled by a circuit 24 also providing a signal CTRL for controlling the value applied by source 21.

The operation of circuit 20 illustrated in FIG. 3 can be easily understood after what has been discussed in the implementation of the method according to the present invention. In normal operation, switches K1 and K2 connect resistor 1 to application circuit 10. When its value is desired to be irreversibly decreased, it is started by connecting terminals 3 and 4 of resistor 1 to terminals 22 and 23 of voltage source V. Then, an adapted voltage is applied so that current I flowing therethrough exceeds the maximum of the corresponding curve (FIG. 2). Then, the resistor is reconnected to terminals 12 and 13 of circuit 10 by means of switches K1 and K2. Preferably, the idle position of switches K1 and K2 will be a connection across circuit 10 to avoid continuous power consumption of the control circuit outside of constraint phases for an irreversible decrease in the resistance. The disconnection of the resistor from circuit 10 during constraint phases enables avoiding any risk of damaging circuit 10 by applying a current of a few milliamperes necessary to modify the resistance value.

The use of two switches has been described to better show the operation. In practice, and especially if the parameterizing control is integrated with the application, a single switch will be used, the other terminal of the resistor being connected to a (supply or ground) terminal common to the parameterizing and application circuits.

Figure 4:
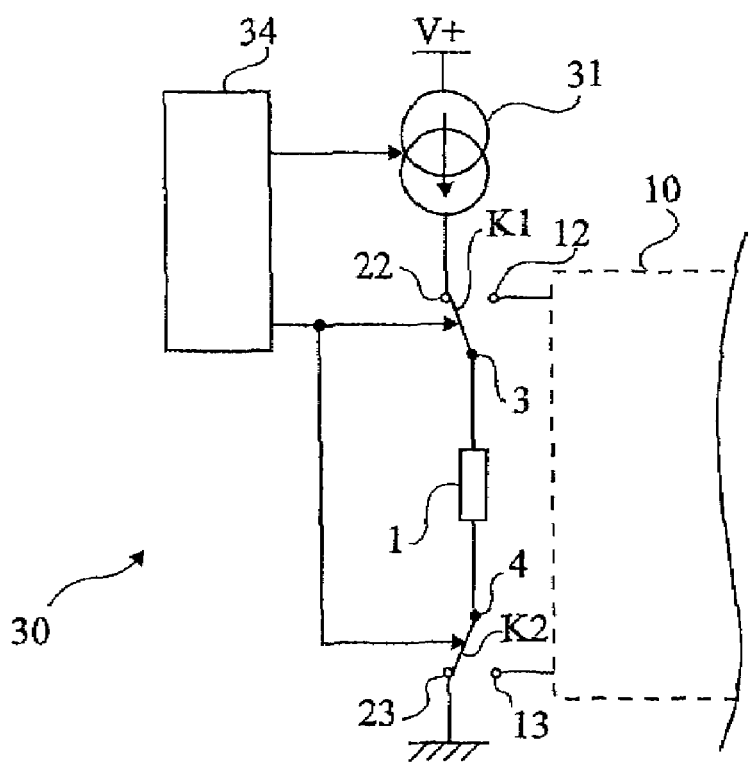
FIG. 4 very schematically shows a second embodiment of a device for controlling an irreversible decrease in the value of a polysilicon resistor according to the present invention.

FIG. 4 shows a second embodiment of a circuit 30 for controlling an irreversible decrease in the value of a polysilicon resistor 1. The embodiment of FIG. 4 differs from that of FIG. 3 in that the constraint applied to resistor 1 is performed by means of a controllable current source 31 and not of a voltage source. In the embodiment of FIG. 4, the connections of resistor 1 in operation are unchanged as compared to the embodiment of FIG. 3, that is, it is connected to terminals 12 and 13 of an application circuit 10. Resistor 1 is still connected to terminals 12 and 13 by switches K1 and K2. However, the value decrease control connection, that is, the connection to terminals 22 and 23, here results in placing resistor 1 in series with controllable current source 31. Source 31 is controlled by a circuit 34 also synchronizing the switching of switches K1 and K2.

An advantage of the present invention is that it enables stable and irreversible controllable decrease in the value of a polysilicon resistor.

Another advantage of the present invention is that the currents required to carry out the irreversible decrease in the resistance value are compatible with the control elements conventionally integrated therewith.

Another advantage of the present invention is that the irreversible modification of the resistance value is not destructive and thus does not risk damaging other parts of the circuit. This especially enables providing a decrease in the resistance value after manufacturing, and even during its lifetime in its application circuit.

Another advantage of the present invention is that the obtained modification of the resistance value is optically invisible, unlike a destruction. The present invention can thus be used in so-called security applications, that is, where the operation of an integrated circuit or of certain codes associated therewith are desired to be masked.

It should be noted that the present invention is easily transposable from one technology to another.

The present invention finds many applications in any field where an irreversible decrease in the value of a resistance in an integrated circuit is desired to be caused.

Figure 5:
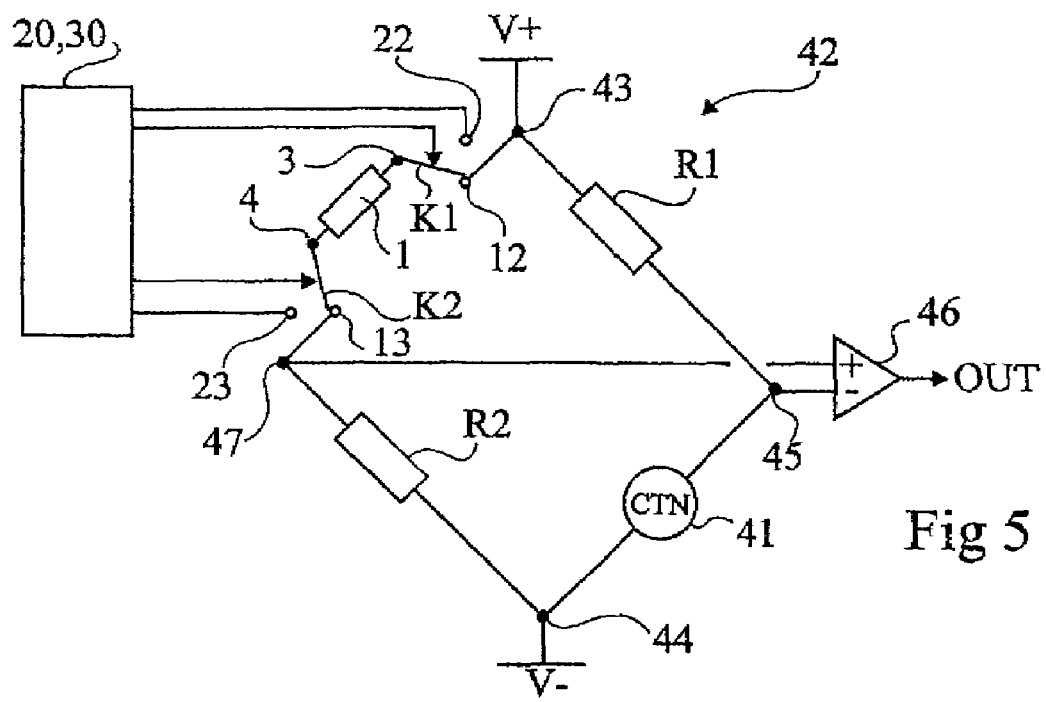
FIG. 5 shows a first example of application of a resistor according to the present invention to the calibration of an electronic thermometer.

FIG. 5 schematically shows a first example of application of the present invention to the calibration of a temperature probe.

According to this example, a sensor formed of a negative temperature coefficient (NTC) resistor 41 is connected in a bridge structure, the different branches of which comprise other resistors. Among these, the resistor opposite to sensor 41 is a controllable resistor 1 according to the present invention. The two other resistors are standard resistors R1 and R2, in that, even if they are polysilicon resistors, they are not controllable to decrease their value according to the present invention. Bridge 42 is connected across two terminals 43 and 44 of application of a supply voltage, that is, connections to, for example, respective positive and ground voltages V+ and V−. In the example of FIG. 5, a first branch of the bridge is formed of the series association, between terminals 43 and 44, of resistor R1 and of sensor 41, the junction point being connected to a first, for example, inverting input 45, of a differential measurement amplifier 46. A second branch of the bridge is formed of the series association, between terminals 43 and 44, of controllable resistor 1 and of resistor R2. A first terminal of controllable resistor 1, that is, terminal 12 of switch K1, is connected to positive supply terminal 43. Terminal 13 of switch K2, that is, the second terminal in operation of resistor 1, is connected to non-inverting terminal 47 of amplifier 46 and to a first terminal of resistor R2, the other terminal of which is connected to negative power supply 44. The output of amplifier 46 provides a signal OUT representative of the temperature measurement performed by means of sensor 41. According to whether the amplifier is assembled or not as a comparator, the measurement provides either a detection with respect to a temperature threshold, or an analog difference. Resistor 1 may be controlled by means of a voltage or current circuit, respectively 20 or 30. This circuit has been generally illustrated by a block in FIG. 5. Resistor 1 is used to calibrate the sensor in temperature, for example, by means of a reference thermometer. Resistor 1 here replaces a network of switchable resistors of a conventional calibration circuit.

In this application, it should only be ascertained to provide a resistor having a sufficiently high original nominal value to ensure that the calibration only requires a decrease in its value.

Figure 6:
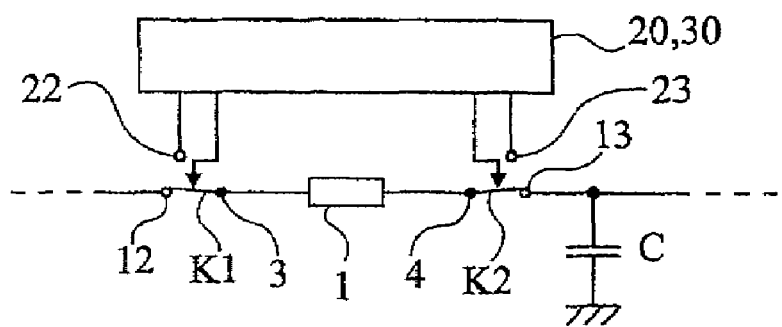
FIG. 6 shows a second example of application of a resistor according to the present invention to a resistive and capacitive network.

FIG. 6 shows a second example of application of the present invention to an RC network. In this example, again, a controllable resistor 1 according to the present invention is associated with a control circuit 20 or 30 such as illustrated in FIGS. 3 and 4. Thus, resistor 1 is surrounded by two switches K1 and K2, terminal 12 of switch K1 here forms the input terminal of the RC circuit. Terminal 13 of switch K2 is connected to a first electrode of a capacitor C, the other electrode of which is grounded. Terminal 13 forms the output of the RC cell. The operation of a cell such as illustrated in FIG. 6 is perfectly conventional. Controllable resistor 1 of the present invention enables, irreversibly by decrease in its value, decreasing the time constant of the RC cell.

Other applications of the present invention may be envisaged. For example, and non-limitingly, it may be provided, by means of a controllable resistor according to the present invention, to modify the quality factor of an electromagnetic transponder by modifying the resistance of the series resonant circuit forming it. More generally, the present invention may be used as an "analog" storage element, the stored value depending on the resistance value.

According to another example, the resistance value may be decreased along the uses of an integrated circuit, to reach a limiting value corresponding to a maximum number of uses.

Preferably, the polysilicon forming the resistive elements of the present invention is not submitted to a metal deposition conventionally used to decrease the resistance of MOS transistor gates.

According to a particular implementation of the invention, the constraint current is comprised between 1 and 10 mA.

Always according to a particular implementation, the dopant concentration in the polycrystalline silicon is comprised between $1\times10^{13}$ and $1\times10^{16}$ at/cm$^3$.

For example, polycrystalline silicon resistors have been made with the following nominal characteristics.

| Polycrystalline silicon type | Crystalline | Crystalline | Amorphous |
| --- | --- | --- | --- |
| Technology | 0.18 μm | 0.18 μm | 0.35 μm |
| Width | 0.5 μm | 0.5 μm | 0.9 μm |
| Length | 3.4 μm | 80 μm | 45 μm |
| Thickness | 200 nm | 200 nm | 250 nm |
| resistance/square | 80 ohms/□ | 100 ohms/□ | 115 ohms/□ |
| Global resistance | 556 ohms | 16000 ohms | 5750 ohms |
| Dopant concentration (atoms/cm3) | As = 6 × 10$^{15}$ | As = 5 × 10$^{15}$ | P = 1 × 10$^{13}$<br>As = 4 × 10$^{15}$ |
| Constraint current for reducing by one half the resistor | 5.5 mA | 4.8 mA | 2.75 mA |

Of course, the present invention is likely to have various alterations, modifications, and improvement which will readily occur to those skilled in the art. In particular, the sizing of the polysilicon resistors to obtain a nominal value depends on the application and is within the abilities of those skilled in the art based on the functional indications given hereabove.

Further, other applications and control circuits than those described hereabove as an example may be envisaged. In particular, the control of the resistance value decrease performed according to the present invention may be voluntary or automatic according to the applications.

Moreover, the number of controllable resistors usable in an integrated circuit is not limited. They may even, if necessary, share a same control circuit.

Finally, although the control circuit is preferentially integrated with the resistor, which in particular eases the implementation of the method during the resistor lifetime, it is not excluded to use a separate circuit to force the constraint current in the resistor. In this regard, the voltage or current constraint values for the implementation of the present invention are within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for irreversibly decreasing a value of a resistance of an integrated polysilicon resistor, comprising temporarily submitting the resistor to a constraint current greater than a current for which the value of the resistance exhibits a maximum, the polysilicon resistor having a dopant concentration of polycrystalline silicon that is between approximately $1\times10^{13}$ atoms/cm$^3$ and approximately $1\times10^{16}$ atoms/cm$^3$.

2. The method of claim 1, wherein the constraint current to which the resistor is submitted is beyond an operating current range of an integrated circuit comprising the resistor.

3. The method of claim 1, comprising the steps of:
   increasing step by step the current in the resistor; and
   measuring, after each application of a greater current, the value of the resistance in its normal functional environment.

4. The method of claim 1, comprising using a predetermined table of correspondence between the constraint current and a desired final resistance to apply the constraint current to the resistor.

5. The method of claim 1, wherein the constraint current is between approximately 1 mA and approximately 10 mA.

6. A device for irreversibly decreasing a resistance value of an integrated polysilicon resistor, comprising a circuit for temporarily imposing on the resistor a constraint current greater than a current value for which the value of the resistance exhibits a maximum, the polysilicon resistor having a dopant concentration of polycrystalline silicon that is between approximately $1\times10^{13}$ atoms/cm$^3$ and approximately $1\times10^{16}$ atoms/cm$^3$.

7. The device of claim 6, wherein the polysilicon resistor is connected to at least one switch of selection between an application circuit and a control circuit controlling a decrease in the resistance value.

8. The device of claim 7, wherein the control circuit comprises a voltage source capable of being connected across the resistor, said voltage source being controllable by a circuit synchronizing a switching of said switch.

9. The device of claim 7, wherein the control circuit comprises a current source capable of being connected in series with the resistor across two supply terminals, the current source being controllable by a circuit for synchronizing said switch.

10. The device of claim 6, wherein the constraint current is between approximately 1 mA and approximately 10 mA.

11. The device of claim 6, further comprising a control circuit constructed and arranged to impose a flowing of the constraint current greater than the current value for which the value of the resistance exhibits the maximum.

12. The device of claim 11, further comprising an application circuit comprising said polysilicon resistor.

13. The device of claim 12, further comprising a switch configured to switch between connecting the polysilicon resistor to the application circuit and connecting the polysilicon resistor to the control circuit.

* * * * *